United States Patent [19]
Koerner

[11] 3,989,932
[45] Nov. 2, 1976

[54] INDUCTIVE LOOP VEHICLE DETECTOR

[75] Inventor: Ralph J. Koerner, Canoga Park, Calif.

[73] Assignee: Canoga Controls Corporation, Canoga Park, Calif.

[22] Filed: Jan. 23, 1975

[21] Appl. No.: 543,309

Related U.S. Application Data

[63] Continuation of Ser. No. 444,519, Feb. 21, 1974, abandoned.

[52] U.S. Cl. .......................... 235/92 FQ; 324/78 D; 324/186; 340/38 L; 340/146.3 K
[51] Int. Cl.² ..................... G01R 23/06; G08G 1/01
[58] Field of Search ......... 340/146.3 K, 38 R, 38 L, 340/258 C; 235/92 T, 92 FQ, 92 TC, 92 TF; 328/42; 331/65, 64; 324/34 PS, 59, 78 Z, 79 D, 186, 187, 78 D

[56] References Cited
UNITED STATES PATENTS

| | | | |
|---|---|---|---|
| 3,205,352 | 9/1965 | Prucha | 340/38 L |
| 3,420,988 | 1/1969 | Hunt et al. | 235/92 T |
| 3,559,066 | 1/1971 | Pincus | 324/186 |
| 3,631,343 | 12/1971 | Schmidhauser | 324/186 |
| 3,665,382 | 5/1972 | Siklos | 340/38 L |
| 3,708,750 | 1/1973 | Bucks et al. | 235/92 T |
| 3,820,100 | 6/1974 | Ballinger et al. | 340/38 L |
| 3,868,626 | 2/1975 | Masher | 340/258 C |
| 3,873,964 | 3/1975 | Potter | 328/42 |
| 3,875,555 | 4/1975 | Potter | 340/38 L |

*Primary Examiner*—Leo H. Boudreau
*Attorney, Agent, or Firm*—Lindenberg, Freilich, Wasserman, Rosen & Fernandez

[57] ABSTRACT

Apparatus for use in combination with an inductive loop for detecting metal objects, e.g. vehicles, in the immediate vicinity of said loop. The loop may, for example, be a coil of wire buried in a roadway in a plane parallel to the roadway surface. Oscillator circuitry is operatively connected to the loop with the frequency of oscillation being determined by the loop inductance, which in turn is dependent on whether or not the vehicle is over the loop. The loop frequency is monitored by digital circuitry including a loop counter which counts loop oscillator cycles and a duration counter which measures the time duration of a fixed number of loop oscillator cycles. The measured time duration is compared with an adaptable reference duration to ascertain whether the loop oscillator frequency has increased or decreased. The presence of a vehicle over the loop decreases loop inductance, increases loop frequency, and thus reduces the measured time duration of a fixed number of loop cycles. A reduction in the measured time duration by an amount greater than a preselected threshold value produces an output signal or "call" to indicate the vehicle's presence.

20 Claims, 4 Drawing Figures

|     | (1) INITIALIZE | (2) Δ LOOP FREQ. | (3) COUNT LO/HI FF | (4) THRESH | (5) ADAPT | (6) COUNT |
| --- | --- | --- | --- | --- | --- | --- |
| (1) | 1 | ↑ | LO | X | FAST | UP |
| (2) | 1 | ↓ | HI | X | FAST | DOWN |
| (3) | X | ↓ | HI | OVER | FAST | DOWN |
| (4) | 0 | ↑ | LO | OVER / UNDER | SLOW / SLOW (AFTER TIMER DELAY) | UP |
| (5) | 0 | ↓ | HI | UNDER | SLOW | DOWN |

INDUCTIVE LOOP VEHICLE DETECTOR

This is a continuation, of application Ser. No. 444,519 filed Feb. 21, 1974, now abandoned.

BACKGROUND OF THE INVENTION

This invention relates generally to metal object detection and more particularly to an inductive loop detector suitable for detecting the passage or presence of a vehicle over a defined area of a roadway.

Inductive loop detectors have been widely used for several years in various applications to detect the presence or passage of a vehicle. For example, such detectors have been used in traffic actuated control systems for developing the input data required by a controller to control signal lights. In another typical application, a detector may be connected to a counter which merely functions to accumulate a count of vehicle flow past a certain point.

Various types of inductive loop detectors suitable for traffic applications are known in the prior art. Each detector generally comprises electronic circuitry which operates in conjunction with a loop (i.e. a wire coil) buried in the roadway in a plane substantially parallel to the roadway surface. The circuitry includes components which, together with the loop, form an oscillator whose frequency is dependent on the loop inductance. The loop inductance is in turn dependent on whether or not the loop is loaded by the presence of a vehicle. A vehicle over the loop decreases loop inductance and thus increases the frequency of oscillation. The circuitry monitors the oscillator frequency and generates a "call" (i.e. a vehicle present signal) when a sufficient frequency change is detected. Different techniques have been employed in prior art detectors for monitoring the oscillator frequency but generally, analog circuitry using filters and phase detectors has been employed.

SUMMARY OF THE INVENTION

The present invention is directed generally to an improved inductive loop detector and more particularly to a detector which employs digital circuitry to monitor the inductance of a loop.

In a preferred embodiment of the invention, the detector defines sequential detect cycles. During each detect cycle, a digital counter (hereinafter sometimes referred to as "the loop counter") counts cycles of the loop oscillator signal. Concurrently, a second digital counter (hereinafter sometimes referred to as "the duration counter") measures the duration of a predetermined number of loop signal cycles by counting pulses provided by a very accurate clock pulse source. The measured duration is then compared with a reference duration (whose value is based upon the measured duration during prior detect cycles) and the difference is indicative of a change in loop signal frequency and thus also a change in loop inductance. A threshold means then determines whether the change is of sufficient magnitude to generate a "call".

In accordance with an important aspect of the invention, the difference (sometimes hereinafter called "deviation") between the measured and reference durations is utilized as an error input to modify (i.e. servo) the reference duration toward the measured duration to thus allow the detector to self-tune or adapt to varying environmental conditions. The rate of adapting is dependent on the magnitude and direction of the deviation.

In accordance with a further aspect of the invention, the reference duration is modified slowly in response to small deviations or differences between the measured and reference time durations. Further, the modification of the reference duration is slow in any event if the deviation is in a first direction, that is, in a direction to generate a "call." On the other hand, modification of the reference duration is rapid in response to large deviations in a second "non-call" direction. As a consequence, the detector is capable of recognizing the continued presence of a vehicle over a relatively long period of time but is also capable of quickly detecting a subsequent vehicle arriving over a loop immediately after a first detected vehicle has departed.

DESCRIPTION OF THE PREFERRED EMBODIMENTS

Figure 1:
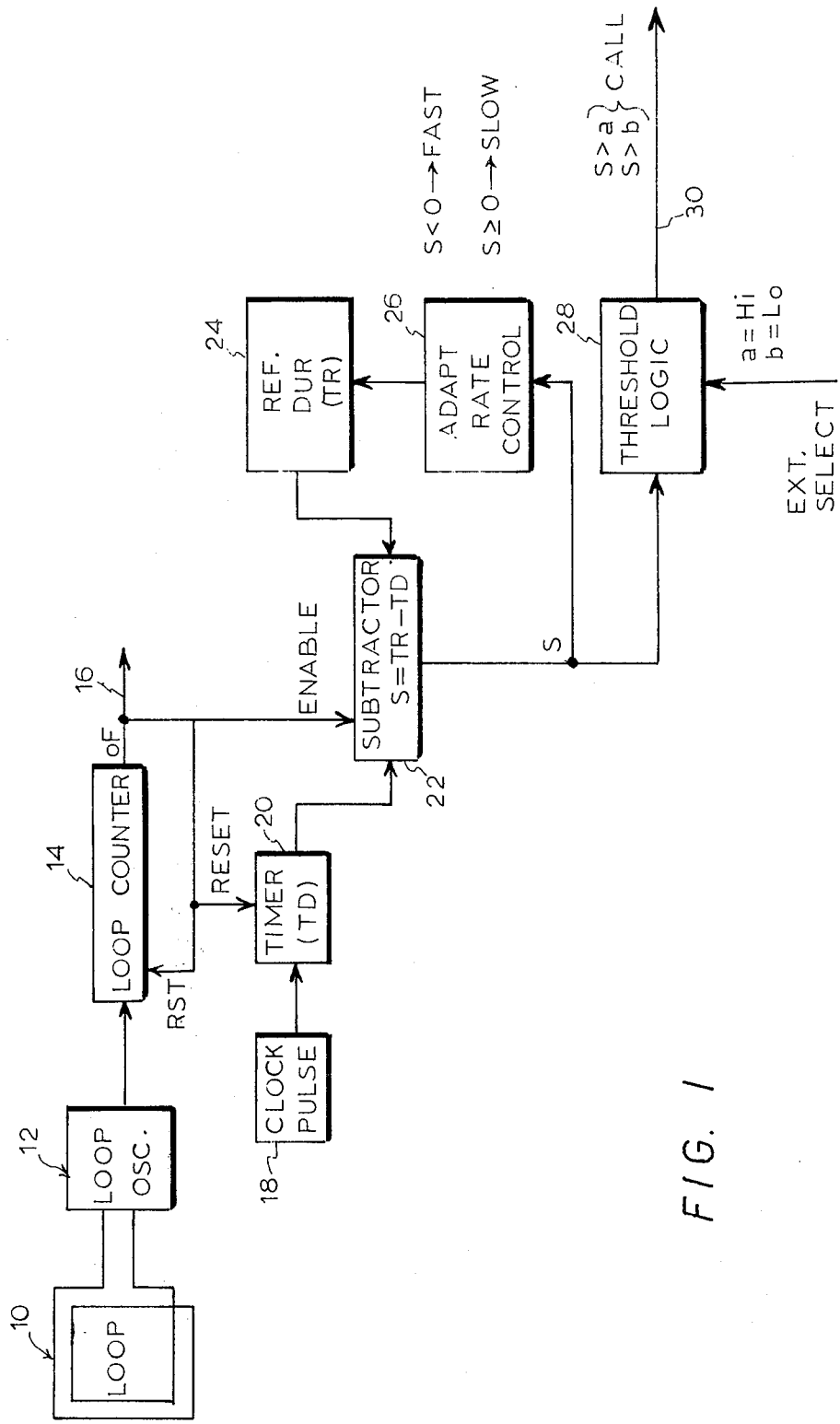
FIG. 1 is a block diagram schematically illustrating an embodiment of the invention.

Attention is now called to FIG. 1 which schematically illustrates a system in accordance with the present invention for monitoring the frequency of an inductive loop 10. In the primary applications of a system in accordance with the invention, the loop 10 is formed by multiple turns (e.g. 3) of electrically conductive wire buried immediately beneath, and substantially parallel to, the surface of a roadway. Typically, a slot is cut into the roadway surface in a rectangular pattern, approximately 6 feet by 6 feet, and the wire is then inserted therein prior to closing the slot with an epoxy sealing compound. However, as is well known in the art, loops of various sizes and configurations can be used.

In an exemplary traffic control application, the loop 10 would be buried beneath the roadway surface in a left turn pocket for the purpose of recognizing the presence, or passage through, of a vehicle. Any large metal mass, such as a vehicle, entering over the area of the loop will change its inductance. Therefore, as is well known in the art, by monitoring the loop inductance, either directly or indirectly, the presence of the metal mass can be detected.

In order to most easily detect changes in loop inductance, the loop 10 is normally connected to oscillator circuitry 12 usually housed in a cabinet at the side of the roadway. As is also well known in the art, the circuitry 12 together with the loop 10 forms an oscillator which oscillates at a frequency dependent upon the inductance of the loop. The circuit values are normally selected so that the center frequency of the loop and oscillator circuitry oscillate at 30 KHz, for example. The frequency deviation caused by a vehicle entering over the loop, of course, depends to a very great extent on the characteristics of the vehicle. A typical passenger car might vary the oscillator frequency by about 2%. A small street approved motorcycle might vary the loop frequency by only 0.05%. By appropriately monitoring the frequency of the loop oscillator signal, frequency changes can be recognized and interpreted as a vehicle to be detected.

In accordance with the present invention as represented in FIG. 1, the loop oscillator signal is applied as an input to a multi-stage loop counter 14. For purposes of explanation, it will be assumed that the loop counter 14 is comprised of 10 stages and is therefore capable of counting 1,024 cycles of the loop oscillator signal. The loop counter 14 provides an overflow signal on output line 16 after the 1,024 loop oscillator cycles have ben counted.

In order to measure the time duration (TD) required for the loop counter 14 to count the 1,024 cycles, a clock pulse source 18 is provided which drives a timer or counter 20. Note that both the timer 20 and loop counter 14 are illustrated as being reset at the same time by the loop counter overflow signal appearing on output line 16.

A comparator or subtractor circuit 22 is provided to compare the measured time duration TD produced by timer 20 with a reference time duration TR stored by storage device 24. FIG. 1 illustrates the subtractor 20 as being enabled by the loop counter overflow signal appearing on line 16. When enabled, the subtractor circuit 22 determines the difference between the measured duration TD and the reference duration TR.

The output of the subtractor circuit 22 is connected to the input of an adapt rate control means 26 which in turn is connected to vary the reference duration defined by storage device 24. More particularly, the adapt rate control means 26 effectively closes a servo loop to vary the reference duration in a direction to reduce the differences between the measured duration TD and reference duration TR.

The signal S provided by the subtractor circuit 22, which is a measure of the difference between the measured duration TD and the reference duration TR, is also applied to the input of a threshold logic network 28. If the difference S exceeds an externally selectable threshold value, e.g. $a$ or $b$, then the threshold logic will generate a call signal on output line 30 to indicate the presence of a vehicle over the loop.

In the operation of the system of FIG. 1, initially consider a situation in which there is no vehicle in the vicinity of loop 10. The loop counter 14 will cyclically count from 0 to 1,023 and will provide an overflow pulse on line 16 once for each cycle, i.e. once for every 1,024 oscillator cycles. The measured time duration TD and the reference time duration TR will be substantially equal and accordingly the difference therebetween S will be substantially zero. Accordingly, the adapt rate control means 26 will not be substantially varying the content of the storage device 24. Nor will the signal S be of sufficient magnitude to cause the threshold logic circuit 28 to generate a call signal on line 30.

Now assume that a vehicle does arrive over the loop 10 thereby reducing its inductance and increasing the frequency of the oscillator signal applied to the loop counter 14. As a consequence, the loop counter overflow signal will be developed earlier than in a prior cycle thereby reducing the measured time duration TD. As a consequence, the signal S provided by the subtractor circuit 22 will jump from zero to some larger number. If it jumps above the threshold value put into the threshold logic circuit 28, then the circuit 28 will develop a call signal on line 30. In addition, the adapt rate control means 26 will begin to vary the content of the storage means 24 in a direction to reduce the value of S toward zero. If the content of the storage device 24 is varied relatively slowly over many cycles of the loop counter 14, then the threshold logic circuit 28 may continue to generate the call signal over a long time period. In this manner, the continued presence of a vehicle over the loop 10 can be detected for a long interval, typically in excess of ten minutes. After the vehicle has been present over the loop 10 for an extended time, the continuing incremental variation of the reference duration content of the storage device 24 will eventually wash out the appearance of the vehicle and thus terminate the call signal provided by the threshold logic circuit 28.

Now assume a different exemplary situation in which no vehicle arrives over the loop 10 but instead the loop inductance changes due to certain slowly changing environmental conditions. Such a change in loop inductance will, of course, also change the frequency of the loop oscillator signal provided to the loop counter 14. As a consequence, the signal as provided by the subtractor circuit 22 will also jump from zero to some higher value. If the higher value is less than the threshold set into the threshold logic circuit 28, then no call signal will be developed on line 30. However, whatever the value of S, it will cause the adapt rate control means 26 to vary the reference duration content of the storage device 24 to thereby adapt the reference duration to the changed environmental conditions.

In explaining the operation of the system of FIG. 1 thus far, we have only considered the situation in which the loop inductance decreases and the loop oscillator frequency increases. Of course, the opposite situation can occur either attributable to changing environmental conditions or a vehicle leaving the area over the loop. In this case, according to the polarity assumed in FIG. 1, the value of signal S will become negative. As a consequence, the threshold logic circuit 28 will ignore the change even if it exceeds the defined threshold value. Thus, no call signal will be developed. In order to distinguish the two conditions of decreasing and increasing loop inductance and corresponding increasing and decreasing loop frequency, we shall sometimes hereinafter refer to the loop frequency as varying in a call direction (as when the loop frequency increases) and a non-call direction (as when the loop frequency decreases). The servo loop closed by the adapt rate control means 26 operates for both directional deviations of the value S developed by the subtractor circuit 22 to vary the reference duration content of the storage device 24 in the direction to reduce the value S towards zero. As will be seen hereinafter, the adapt rate control means 26 operates to selectively vary the reference duration at either a relatively slow or relatively fast rate. More particularly, adapting, that is variation of the reference duration stored by the storage device 24, is accomplished rapidly during an initializing interval when the system is first powered and also when the frequency deviation, as represented by the value S, is large in a non-call direction. On the other hand, the system is caused to adapt slowly in response to small frequency deviations and any deviation in a call direction. As will also be seen hereinafter, this asymmetric manner of adapting to frequency deviations enables the presence of a vehicle to be continually detected over a relatively long period of time, e.g. 10 to 12 minutes, while still enabling a subsequently arriving vehicle to be detected very quickly after a prior vehicle has departed from the area over a loop.

Figure 2:
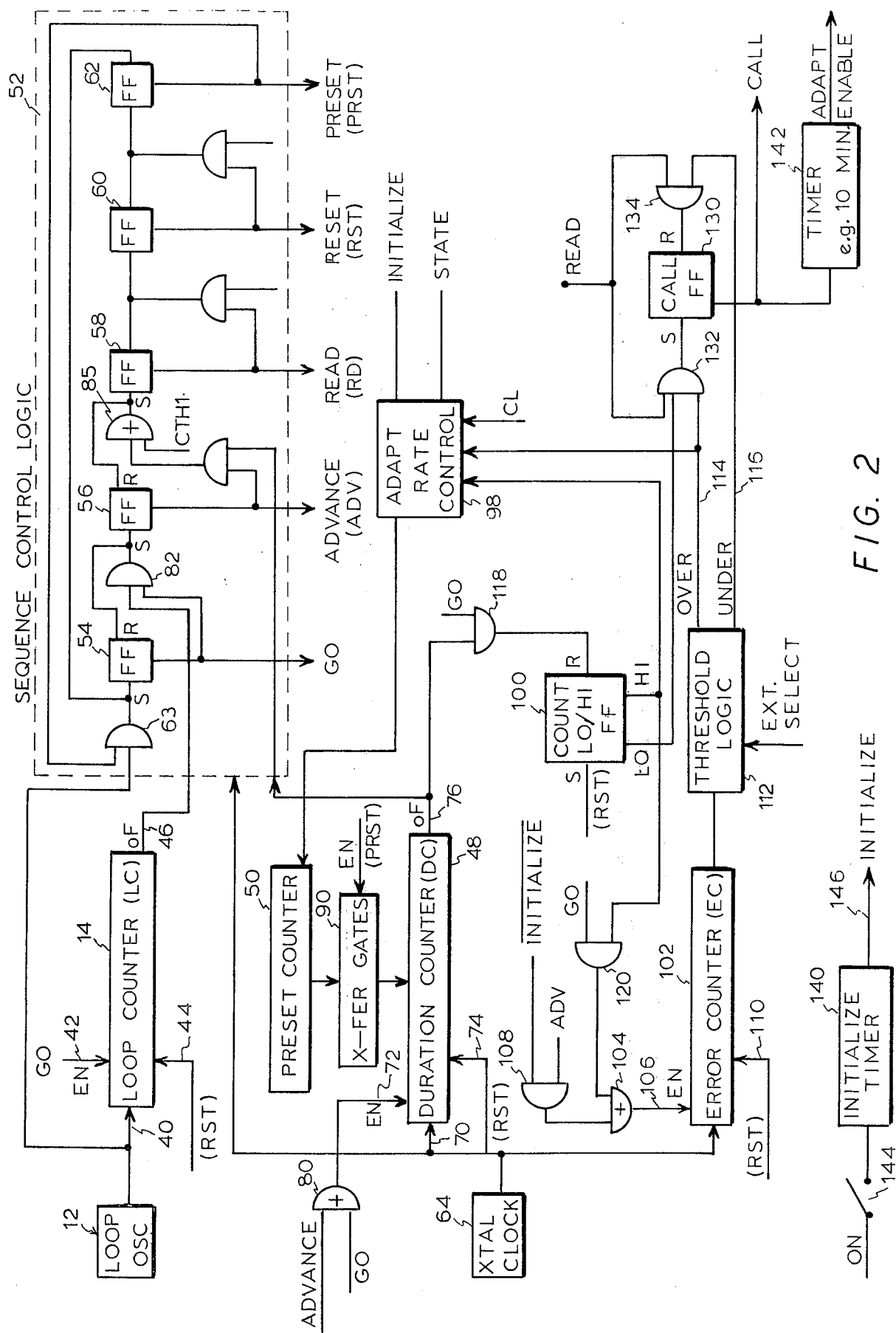
FIG. 2 is a block diagram illustrating in much greater detail a preferred implementation of the invention.

Attention is now called to FIG. 2 which illustrates a preferred implementation of the embodiment of the invention schematically represented in FIG. 1. As in FIG. 1, FIG. 2 illustrates the loop oscillator 12 as providing one input pulse per loop signal cycle to loop counter 14. For purposes herein, it will be assumed that the loop counter 14 of FIG. 2 comprises a 10 stage binary counter capable of defining 1,024 different states, which states will hereinafter be respectively referred to as 0–1,023. Loop counter 14 counts pulses applied by the loop oscillator 12 to the loop counter input terminal 40 when an enabling signal is applied to the loop counter enabling terminal 42. The loop counter 14 can be reset to the zero state in response to a signal applied to the loop counter reset terminal 44. The loop counter 14 provides an overflow signal on output terminal 46 during count 1,023.

As was explained in conjunction with FIG. 1, the frequency of the loop oscillator 12 is monitored by essentially measuring the time duration of a fixed number of loop signal cycles as counted by the loop counter 14. In the preferred implementation of the invention illustrated in FIG. 2, the duration of the fixed number of loop counter cycles is measured by a duration counter 48 in conjunction with a preset counter 50. Prior to considering the functioning of the duration and preset counters, attention is directed to the sequence control logic network 52 which essentially controls the sequencing and operation of the circuitry of FIG. 2.

The sequence control logic network 52 is comprised of five set-reset flip flops 54, 56, 58, 60, 62 which are connected in the form of a ring counter so that only one of the flip flops is true (1) at a time. The progression of the single 1 bit from flip flop 54 and successively through flip flops 56, 58 and 60 to flip flop 62 will be referred to as a "detect cycle." During each detect cycle, five different control states will be defined with different operations and transfers occurring during each control state. Transfer of the single 1 bit from one flip flop to the succeeding flip flop in logic network 52 occurs coincident with a clock pulse provided by a highly accurate crystal clock pulse source 64. Although simplified for the sake of clarity in FIG. 2, it should be understood that clock pulses are provided to the gates connected to the set and reset input terminals of each of the network 52 flip flops so that each flip flop will be set and reset only coincident with the occurrence of a clock pulse provided by source 64.

The control logic network 52, during each detect cycle, successively defines the following states: GO, ADVANCE (ADV), READ (RD), RESET (RST), PRESET (PRST). The foregoing states are successively defined as the single 1 bit progresses from flip flop 54 through flip flops 56, 58, and 60 to flip flop 62. The progression of the 1 bit through the logic network 52 can be considered as being initiated by a "start" signal provided by gate 63 to the set input of flip flop 54. The "start" signal is developed in response to the loop signal cycle succeeding the flip flop 62 going true.

Prior to completing the explanation of the operation of the control logic network 52 and particularly the criteria for advancing the single 1 bit from one flip flop to the next, attention is now again directed to the previously mentioned duration counter 48.

The duration counter 48, like the loop counter 14, is a multiple stage binary counter. It will be assumed herein that the counter 48 is comprised of sixteen stages and is therefore capable of defining 65,536 different states. The duration counter 48 counts clock pulses applied by clock pulse source 64 to the duration counter input terminal 70 when an enabling signal is applied to the duration counter enabling terminal 72. The clock pulse source 64 will be assumed as operating at a 2 MHz rate. In response to a signal applied to the duration counter reset terminal 74, the duration counter will be forced to a zero count. An overflow signal will be provided on the duration counter output terminal 76 when the duration counter defines its highest count 65,535.

During the GO state defined when network flip flop 54 is true, the loop counter 14 will count cycles of the loop oscillator signal as a consequence of the true output terminal of flip flop 54 enabling the loop counter via terminal 42. Additionally, during the GO state, the duration counter 48 will count clock pulses inasmuch as the output terminal of flip flop 54 is connected to the input of OR gate 80 whose output is connected to the enabling terminal 72 of duration counter 48. When the loop counter 14 reaches count 1,023 and generates an overflow signal on terminal 46, logic network flip flop 54 will be reset and flip flop 56 will be set, via AND gate 82, to thereafter define the ADVANCE state. When the duration counter 48 counts to count 65,535 to develop an overflow signal on duration counter output line 76, AND gate 84 will be enabled to reset flip flop 56 and set flip flop 58, via OR gate 85, to switch from the ADVANCE state to the READ state. The RESET state, defined by flip flop 60 going true, occurs on the clock pulse immediately succeeding the state in which flip flop 58 went true. Similarly, flip flop 66 goes true one clock pulse after flip flop 60 goes true.

During the PRESET state of each detect cycle, the content of the previously mentioned preset counter 50 is transferred through gates 90 to the duration counter 48. The preset counter 50 constitutes a binary counter which, it will be assumed herein, is comprised of sixteen stages so that, like the duration counter 48, is capable of defining a count anywhere from zero to 65,535. As will be seen more clearly hereinafter, the function of the preset counter is to load a count into the duration counter during each detect cycle having a magnitude such that the loop counter overflow signal produced on line 46 and the duration counter overflow signal produced on line 76 will substantially coincide in time in the absence of any significant change in loop signal frequency.

Figures 3, 4:
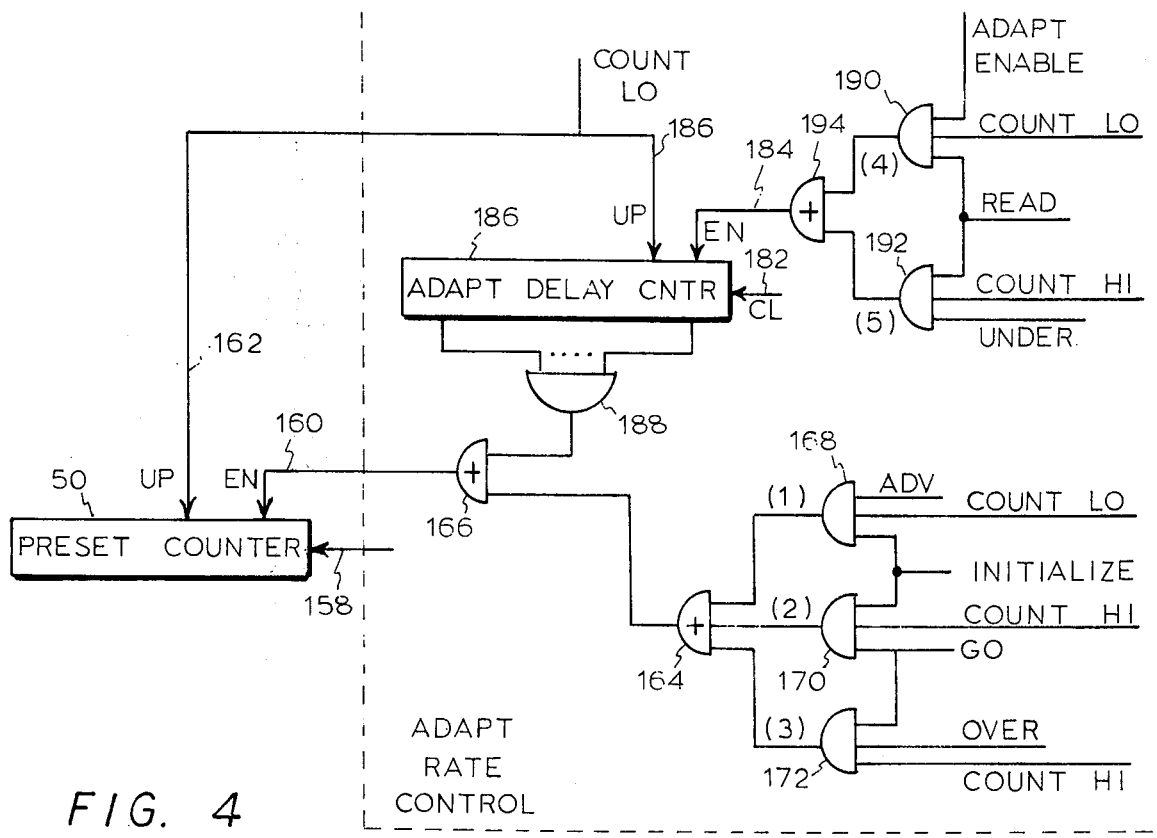
FIG. 3 constitutes a table illustrating the various conditions for causing the adapt rate control means of FIG. 2 to adapt at either a slow or fast rate.
FIG. 4 is a block logic diagram illustrating an implementation of the adapt rate control means of FIG. 2.

More particularly, the content of the preset counter, which is controlled by the adapt rate control means 98, to be discussed in greater detail in connection with FIG. 4, is transferred through the transfer gate 90 to the duration counter during the PRESET state of each detect cycle. In order to gain a basic understanding of the manner of operation of the apparatus of FIG. 2, initially consider that the system is in a quiescent condition with no significant loop signal frequency changes having occurred for a very long period. Under these quiescent conditions, the loop counter 14 and duration counter 48 will overflow substantially coincident in time. Now assume that a vehicle arrives over the loop to increase the frequency of the loop signal. This action will cause the loop counter 14 to count faster, thereby causing the loop counter to provide an overflow signal on line 46 prior to an overflow being provided by the duration counter. As a consequence, and as will be described in greater detail hereinafter, the adapt rate control means 98 functions to raise the count in the preset counter 50 to thereby cause the duration counter to provide its overflow earlier in the detect cycle. That is, the preset counter count is varied by the adapt rate control means 98 in a direction to move the duration counter overflow closer to time coincidence with the loop counter overflow. The closing of the time difference between the loop counter and duration counter overflows occurs incrementally over many detect cycles at a rate determined by the adapt rate control means 98. That is, the time difference between the occurrence of the loop counter and duration counter overflows can be closed rapidly when it is desired that the system adapt very fast to changes in loop inductance or slowly when it is desired that the system adapt slowly to changes in loop inductance. In typical traffic applications where it is often desired to be able to continually detect the presence of a vehicle over a loop for an extended period, the adapt control means 98, in a manner to be described hereinafter in connection with FIG. 4, varies the preset counter 50 slowly to close the time difference between the occurrence of the loop counter and duration counter overflows over a very large number of detect cycles. On the other hand, after a change in loop inductance attributable to a vehicle leaving the area over the loop, when it is desired to prepare the system for very promptly detecting a subsequently arriving vehicle, it is necessary to vary the preset counter rapidly to bring the loop counter and duration counter overflows into time coincidence within relatively few detect cycles.

We have thus far considered the relationship of the loop counter overflow and duration counter overflow during a quiescent condition and after a vehicle arrives over the loop to significantly increase the loop signal frequency. It has been mentioned that as a consequence of the loop signal frequency increasing, the count in the preset counter is varied to cause the duration counter overflow to occur sooner in the detect cycle to thereby close the time difference between the loop counter and duration counter overflows. After a certain interval, e.g. 12 minutes, the system will have fully adapted, that is, the difference between the occurrences of the loop counter and duration counter overflows will have closed entirely and the system will no longer sense the continued presence of the vehicle over the loop. Now consider the situation when the detected vehicle leaves the area over the loop. The loop signal frequency will then decrease, thereby causing the loop counter overflow to appear on line 46 subsequent to the duration counter overflow appearing on line 76. As a consequence, the adapt rate control means will thereafter reduce the count of the preset counter 50 to again vary the time occurrence of the duration counter overflow within each detect cycle to close the time difference between the loop counter and duration counter overflows. Thus, from the foregoing brief explanation of the operation of the apparatus of FIG. 2, it should be appreciated that the reference duration, essentially defined by the duration counter 48, servos to the measured time duration of a fixed number of loop signal cycles to essentially reduce the time difference between the measured and reference time durations to zero.

During the GO state, the loop counter 14 is counting loop signal cycles and the duration counter 48 is counting clock pulses. Assume that the loop counter 14 overflows prior to the duration counter 48 overflowing. This action will reset the flip flop 54 and set the flip flop 56 to thereby switch from the GO to the ADVANCE state. The count lo/hi flip flop 100 which was set during the RESET state of the prior detect cycle will remain set so as to provide a count lo output. During the ADVANCE state, the duration counter 48 will still be enabled via OR gate 80. Thus, the duration counter will continue to count until it overflows. When the duration counter 48 overflows, it resets the flip flop 56 of the control logic network 52 via gate 84 and sets flip flop 58 to thereby switch from the ADVANCE to the READ state. The number of clock pulses occurring during the ADVANCE state are counted by error counter 102. The output of the clock pulse source 64 is connected directly to the input of error counter 102. The error counter 102 is enabled by the output of OR gate 104 connected to the enable input terminal 106 of counter 102. During the ADVANCE state the error counter is enabled as a consequence of AND gate 108 providing a true input to OR gate 104. AND gate 108 is enabled during the ADVANCE state whenever an INITIALIZE state is not defined. An INITIALIZE state is defined only when the system is first powered and will be discussed hereinafter. The error counter is reset during each RESET state of a detect cycle via input terminal 110. Thus, the error counter 102 counts the number of clock pulses or duration of the ADVANCE state which, of course, represents the time difference between the occurrence of the loop counter overflow and the duration counter overflow.

The output of the error counter is connected to the input of a threshold logic network 112, analogous to the logic network 28 discussed in connection with FIG. 1. The logic network 112 represented in FIG. 2 is illustrated, for convenience, as having two output terminals which respectively go true in the event that the count provided by the error counter exceeds or is less than the threshold defined by the logic network 112. More particularly, if the count defined by the error counter 102 exceeds the threshold loaded into logic network 112, then overthreshold output line 114 goes true. On the other hand, if the count defined by the error counter 102 is less than the threshold value loaded into the logic network 112, then the underthreshold line 116 goes true. The threshold output lines 114 and 116 are used in determining when a "call" should be generated and will be discussed further hereinafter.

Assume now the situation in which, during a detect cycle, the duration counter overflow occurs on line 76, prior to the occurrence of the loop counter overflow on line 46. In this event, the duration counter overflow will be occurring during the GO state and will therefore reset the count lo/hi flip flop 100 via AND gate 118. This will cause flip flop 100 to define a count hi condition, thereby enabling AND gate 120 during the GO state. The output of AND gate 120 is connected to the input of OR gate 104 which, as has been mentioned, enables error counter 102. Thus, the error counter 102 will count the number of clock pulses or duration between the occurrence of the duration counter overflow and the loop counter overflow. As has been previously mentioned, the threshold logic network 112 determines whether the count accumulated by the error counter 102 is over or under a threshold value loaded therein. It should also be pointed out that when the loop counter overflow does occur, it will terminate the GO state and transfer the the control logic network 52 to the ADVANCE state. However, with the count lo/hi flip flop 100 defining a count hi state, the control logic means 52 will be switched on the immediately succeeding clock pulse out of the ADVANCE state into the READ state.

A call flip flop 130 is provided which, when set, provides a call signal, indicating vehicle presence. The call flip flop 130 is set and reset respectively via gates 132 and 134 during the READ state defined by the sequence control logic means 52 when flip flop 58 is true. The call flip flop 130 will be set via gate 132 when, during each detect cycle, the count flip flop 100 defines a count lo state and the threshold logic network 112 recognizes the error counter as defining an overthreshold condition. It should be understood that the count lo state defined by flip flop 100 will occur if the loop counter overflow occurs prior to the duration counter overflow during a detect cycle. The overthreshold condition, meaning that line 114 is true, will occur if the count accumulated in the error counter 102 during that detect cycle has a magnitude greater than the threshold loaded into the threshold logic 112. If the error counter count exceeds the threshold, it essentially means that the measured time duration of a fixed number of loop signal cycles has deviated sufficiently from the reference time duration so as to conclude that a vehicle did, indeed, arrive over the loop, The call flip flop 130 is reset during the READ state of each detect cycle if the threshold logic 112 indicates that the frequency deviation of the loop signal frequency, as indicated by the magnitude of the count in the error counter 102, is not sufficient to generate a call. In order to prevent the call flip flop 130 from toggling back and forth in a situation where the threshold is barely exceeded, the threshold logic 112 preferably defines a lower count for each selectable threshold level such that after the threshold is exceeded, the overthreshold signal will be maintained until the error falls below a level less than the threshold. For example only, assume a threshold level of 12 counts. When the error exceeds twelve counts, the overthreshold signal will be provided and maintained until the error falls below 11 counts, for example.

Prior to proceeding to FIGS. 3 and 4 which illustrate the implementation and conditions of operation of the adapt control means 98, an initialize timer 140 and an adapt enable timer 142 should be noted in FIG. 2. The initialize timer 140 is merely responsive to the system initially being turned on, as by schematically illustrated power switch 144. The initialize timer 140 defines an interval, e.g. 30 seconds, during which the system is caused to adapt very rapidly to existing environmental conditions. During this interval, the timer 140 will provide an initialize signal on line 146 which will enable a count to be rapidly accumulated in the preset counter 50 to bring the duration counter overflow 76 into substantial time coincidence with the loop counter overflow. In order to prevent the generation of a call during this initialize interval, the initialize signal is used to disable AND gate 108 connected to the input of OR gate 104 coupled to the enable input terminal of the error counter 102. As a consequence, the error counter 102 will not count clock pulses occurring after the loop counter overflow and prior to the duration counter overflow during this initialize interval. This will prevent the generation of a call but will not prevent the adapt rate control means from varying the preset counter 50 as will be described hereinafter.

The timer 142 is enabled in response to the development of a call by the flip flop 130 and functions to define an interval of perhaps 10 minutes. As will be seen hereinafter in FIG. 4, during this 10 minute interval, the system is prevented from adapting, that is, from varying the count in preset counter 50. Use of the adapt enable timer 142 enables the system to hold the presence of a vehicle longer before the continued vehicle presence is washed out by the adaptation of the system.

The overall function of the adapt rate control means 98 of FIG. 2 was discussed in connection therewith. It will be recalled that the adapt rate control means is responsive to an error accumulated by the error counter 102 and closes a servo loop by varying the preset counter in a direction tending to move the occurrence of the duration counter overflow into time coincidence with the loop counter overflow. It has further been mentioned that the adapt rate control means 98 functions to either relatively slowly or rapidly vary the count in the preset counter 50 so as to correspondingly either slowly or rapidly adapt to changes in loop inductance.

In order to secure a more concrete understanding of a preferred implementation of the adapt rate control means 98, attention is initially directed to the table of FIG. 3 which represents the manner in which the preset counter 50 is varied in response to various conditions. The table of FIG. 3 is comprised of five lines each representative of a different set of conditions illustrated in columns 1–4. Columns 5 and 6 illustrate the action taken. The six columns in each line are intended to represent the following:

Column 1: INITIALIZE — 1 and 0 respectively represent a point in time condition inside and outside of the initialize interval defined by the timer 140. The X in column 1 in line 3 indicates that for the other conditions indicated in line 3, it makes no difference as to whether or not the initialize interval is being defined.

Column 2: Δ loop frequency — the arrows in column 2 indicate a change in loop frequency in either an increasing or decreasing direction. Loop frequency increases when a vehicle arrives over the loop to decrease loop inductance and decreases when a vehicle departs from the area over the loop.

Column 3: Count lo/hi flip flop — this column represents the state of the flip flop 100 of FIG. 2.

Column 4: Threshold — this column represents the decision of the threshold logic network 112 as to whether the count in the error counter 102 is over or under the defined threshold value. An X in this column means that the actions indicated in columns 5 and 6 are taken regardless of the threshold condition.

Column 5: Adapt — this column represents the desired rate of adapting, i.e. either slow or fast, of the preset counter 50 in response to the conditions represented in columns 1–4.

Column 6: Count — this column represents the direction in which the preset counter 50 must be counted, either up or down, in response to the conditions represented in columns 1–4, to permit the system to adapt.

Line 1 of FIG. 3 indicates that during the initialize period, in response to an increase in loop frequency, the count flip flop 100 will define the lo state and regardless of the threshold condition, the preset counter 50 should be rapidly counted up toward bringing the duration counter overflow into time coincidence with the loop counter overflow.

Line 2 of FIG. 3 indicates that during the initialize interval, in response to a decreasing loop frequency, producing a count hi condition in flip flop 100, then regardless of the threshold decision reached by logic network 112, the preset counter 50 should be rapidly counted down to bring the duration counter overflow toward time coincidence with the loop counter overflow.

Line 3 of FIG. 3 indicates that whenever the loop frequency decreases to produce a count hi condition in flip flop 100, if the error exceeds a threshold value, then the preset counter should be rapidly counted down, again to bring the duration counter overflow toward time coincidence with the loop counter overflow. Line 3 represents the condition in which the system has adapted to the presence of a vehicle and then the vehicle suddenly leaves the area over the loop causing the loop frequency to decrease. In this case, it is desirable for the system to adapt rapidly to this new condition to enable it to quickly detect a vehicle subsequently arriving over the loop area.

Line 4 of FIG. 3 represents the situation after the initialize interval has terminated and where the loop frequency has increased to cause the count flip flop 100 to define a count lo state. If the threshold logic network 112 indicates an overthreshold condition, a call will be developed by call flip flop 130 of FIG. 2 but, in addition, the adapt rate control 98 will slowly count the preset counter 50 upwardly, after the time delay introduced by timer 142 of FIG. 2. Under the same conditions, also represented in line 4 of FIG. 3, if the error counter does not produce an overthreshold indication by logic network 112, then no call is generated and no delay is introduced by timer 142 prior to adapting to the change in frequency. That is, the slow counting up to the preset counter is initiated immediately. Thus, line 4 of FIG. 3 represents a change or deviation in the loop frequency in the call direction. If the deviation is of sufficient magnitude to generate a call, then adaptation is disabled during the interval defined by timer 142. If the deviation is not sufficient to generate a call, as might be caused by slowly varying environmental conditions, then adaptation is initiated immediately at a slow rate.

Line 5 of FIG. 3 represents the condition occurring after the initialize period when the loop frequency decreases to produce a count hi condition in flip flop 100. If the deviation is less than a threshold value defined by logic network 112, then the preset counter 50 is counted down slowly to move the duration counter overflow toward coincidence with the loop counter overflow.

Summarizing the actions of FIG. 3, it should be recognized that during the initialize period, the system always adapts rapidly. After the initialize period, the system always adapts slowly if the deviation is less than the defined threshold. If the deviation is over the defined threshold, then if in the call direction, adaptation is slow and if in the non-call direction, adaptation is rapid.

Attention is now called to FIG. 4 which illustrates a preferred implementation of the adapt rate control means 98 of FIG. 2 for implementing the various conditions set forth in the table of FIG. 3. The preset counter shown in FIG. 4 is the same preset counter 50 referred to in FIG. 2. As has been previously stated, the preset counter is comprised of 16 binary stages. The preset counter counts clock pulses provided by clock pulse source 64 (FIG. 2) applied to the date input terminal 158 of the preset counter. In order for the preset counter to count, an enabling signal must be applied to the enabling control terminal 160. The preset counter 50 is connected as an up/down counter which normally counts down except when an up control signal is applied to the up control line 162.

It will be recalled that lines 1, 2 and 3 of FIG. 3 indicate the conditions for fast adapting the preset counter 50. In accordance with the implementation of FIG. 4, in order to fast adapt the preset counter 50, it is directly enabled via OR gates 164 and 166. That is, as long as gates 164 are enabled, then the preset counter 50 will count clock pulses applied to input line 158. The three AND gates 168, 170 and 172 respectively represent the implementations of the first, second and third lines of FIG. 3.

More particularly, AND gate 168 is enabled during the initialize interval when the count is lo for the duration of the ADVANCE state defined by flip flop 56 of the sequence control logic means 52. It will be recalled that the duration of the ADVANCE state when the count is lo is directly related to the frequency deviation or the error accumulated by error counter 102. Thus, AND gate 168 will enable the preset counter 50, via OR gates 164 and 166 for the duration of the ADVANCE state and the preset counter will be caused to count up since the count lo signal provided by flip flop 100 of FIG. 2 is connected to the up control terminal 162 of preset counter 50.

AND gate 170 similarly implements line 2 of FIG. 3 but in this case, the duration for which the AND gate 170 is enabled is determined by the duration of the GO state after count flip flop 100 goes hi. This duration is representative of the deviation of the loop signal frequency.

Gate 172 implements the conditions for fast adapting the preset counter in accordance with line 3 of FIG. 3 and is enabled for a duration related to the magnitude of the deviation of the loop signal frequency. When gates 170 and 172 are enabled, the preset counter counts down.

In order to slow adapt the preset counter 50, the clock pulses are passed through an adapt delay counter 180 which essentially divides by 1,024. That is, the adapt delay counter constitutes a bidirectional ten stage counter capable of counting from zero to 1,023. Clock pulses are applied to input terminal 182 of the adapt delay counter 180 which counts when an enabling signal is applied to enabling control terminal 184. The adapt delay counter 180 normally counts down except when a control signal is applied to the up control terminal 186. A count detector, e.g. AND gate 188, is connected to the output of the adapt delay counter 180 to detect the occurrence of single count, e.g. 1,023. Whenever the gate 188 detects this count, it enables the preset counter via OR gate 166 to permit one clock pulse into the preset counter 50. It is important to note that when the system is fast adapting, the preset counter is enabled via OR gate 164 and OR gate 166 and the preset counter 50 directly counts clock pulses. When the system is slow adapting, the preset counter is enabled via AND gate 188 and OR gate 166 and the preset counter essentially counts only one out of every 1,024 clock pulses.

Clock pulses are counted by the adapt delay counter 180 during the times and under the conditions represented by AND gates 190 and 192 which essentially implement lines 4 and 5 of FIG. 3. More particularly, AND gate 190 is enabled when the count lo condition is defined during the single clock pulse READ state defined by flip flop 58 of sequence control logic means 52. Moreover, AND gate 190 will be enabled only when the adapt enable signal is provied after the expiration of the delay interval defined by timer 142.

AND gate 192 will be enabled when the count is hi and when an underthreshold condition exists. The outputs of AND gates 190 and 192 are coupled to the input of OR gate 194 which controls the enable input line of the adapt delay counter 180.

In the operation of the adapt rate control means of FIG. 4, assume initially that the apparatus of FIG. 2 is initially powered to define the initialize interval. During the initialize interval, let it be assumed as an example that the loop counter overflow occurs considerably before the duration counter overflow and that during several detect cycles, the error counter 102 fills to its capacity of 64. This will mean that during each of these detect cycles, the ADVANCE state as defined by the sequence control logic means 62 will have a duration of 64 clock pulses and that gate 168 of FIG. 4 will load 64 clock pulses into the preset counter 50 during each detect cycle. Thus, the contents of the preset counter 50 will incrementally increase thereby closing the time interval between the development of the loop counter overflow and the duration counter overflow. Ultimately, the loop counter and duration counter overflows will be substantially coincident in time. Assume now the termination of the initialize interval. With the loop counter and duration counter overflows substantially time coincident, the threshold logic 112 will define an underthreshold condition. During each single clock pulse READ state, one clock pulse will be entered into the adapt delay counter 180 to either count it up or down depending upon whether the loop counter or duration overflow occurs first, i.e. dependent upon the state of the count flip flop 100. When the system is quiescent, during each detect cycle, the adapt delay counter 180 will perhaps count one count up or down but this will normally have no effect on the preset counter since the preset counter is enabled for only one clock pulse, in response to only one particular count of the 1,024 counts definable by the adapt delay counter 180.

Now assume the condition represented by line 4 of FIG. 3 in which the loop counter frequency substantially increases and an overthreshold condition develops. From what has previously been said, it should be recognized that this will cause the call flip flop 130 (FIG. 2) to produce a call and will cause the timer 142 to disable the adapt enable signal for a time interval. During this interval, no inputs will be provided to the adapt delay counter 180. After the expiration of the interval defined by timer 142, gate 190 will be enabled to enter one count into the adapt delay counter 180 for each detect cycle. For every 1,024 counts entered into the adapt delay counter 180, only one count will be passed through to the preset counter 50. Thus, the preset counter 50 will be incremented only once for every 1,024 detect cycles. This slow rate of adapting in the preset counter assures that the presence of the vehicle can be maintained for a long period of time such as twelve minutes. Now assume that the vehicle over the loop departs and that the loop frequency suddenly decreases as represented by line 3 of FIG. 3. This action enables the gate 170 so that clock pulses are supplied directly to the preset counter 50 for a duration established by the interval of the GO state after the count flip flop 100 is switched to a count hi condition. That is, for a duration dependent upon the deviation or difference between the occurrence of the loop counter and duration counter overflows, clock pulses are directly input into the preset counter 50. In this case, for example, if the error counter counted to 64 counts, then during each detect cycle 64 clock pulses would be entered into the preset counter. This fast adapt rate contrasts markedly with the slow adapt rate in which one count is permitted into the preset counter 50 for every 1,024 cycles. Thus, during fast adapting, the system is able to adapt more than 60,000 times faster than it adapts during slow adapting.

The embodiments of the invention in which an exclusive property or privilege is claimed are defined as follows:

1. Apparatus useful in conjunction with a roadway for detecting the presence of a vehicle on a specified area of the roadway, said apparatus comprising:
   a loop of wire supported adjacent the surface of said roadway within said specified area;
   oscillator circuit means connected to said loop of wire for oscillating at a frequency dependent on the inductance of said loop;
   timing means for measuring the time duration of a fixed number of cycles of said oscillator circuit means;
   reference means defining a reference duration;
   comparison means for determining the difference between said measured time duration and said reference duration; and
   threshold means responsive to said difference exceeding a threshold value for generating a signal indicative of the presence of a vehicle in said specified area.

2. The apparatus of claim 1 wherein said timing means includes a first counter means for counting said fixed number of cycles;
   a source of clock pulses; and
   a second counter means for counting clock pulses during the interval said first counter means is counting;

3. The apparatus of claim 1 further including feedback means responsive to said difference for varying said defined reference duration in a direction tending to reduce said difference toward zero.

4. The apparatus of claim 3 wherein said feedback means includes slow means for varying said reference duration at a slow rate and fast means for varying said reference duration at a fast rate; and
   means responsive to the magnitude and direction of said difference for selectively enabling either said slow means or said fast means.

5. The apparatus of claim 3 further including means responsive to said threshold means generating a signal for disabling said feedback means for a predetermined interval.

6. Detection apparatus useful for detecting the presence of a vehicle on a specified area of a roadway comprising:
   a conductive loop mounted proximate to the surface of said roadway enclosing an area substantially coincident with said specified area;

circuit means disposed remote from said loop and operatively connected thereto for producing an oscillator signal whose frequency is related to the inductance of said loop;

sequence control means defining successive detect cycles and including means for generating a start signal during each detect cycle;

a first counting means for counting cycles of said oscillatory signal occurring after said start signal and for generating a first overflow signal after M counts;

a source of clock pulses;

a second counting means for counting clock pulses occurring after said start signal and for generating a second overflow signal after N counts;

preset means for loading a count number into said second counting means prior to said start signal; and means responsive to said first overflow signal occurring prior to said second overflow signal for generating a call signal indicative of the presence of a vehicle in said specified area.

7. The apparatus of claim 6 including means for varying the count number loaded by said preset means during each detect cycle in a direction to reduce the interval between generation of said first and second overflow signals.

8. The apparatus of claim 6 wherein said means for generating said call signal includes:

third counting means for developing a count representing the number of clock pulses occurring between the generation of said first and second overflow signals; and threshold means defining a call threshold level and wherein said call signal is generated only when said count developed by said third counting means exceeds said call threshold level.

9. The apparatus of claim 8 including means for varying the count number loaded by said preset means during each detect cycle in a direction to reduce the interval between generation of said first and second overflow signals;

said means for varying the count number including means for selectively varying at either a fast or slow rate dependent on the count developed by said third counting means.

10. The apparatus of claim 9 including timer means responsive to the generation of said call signal for defining an interval of fixed duration; and means for disabling said means for varying said count number during said interval of fixed duration.

11. The apparatus of claim 9 wherein said means for selectively varying said count number includes means responsive to both (1) said first overflow signal occurring prior to said second overflow signal and (2) said count developed by said third counting means exceeding a threshold value for varying said count number at said fast rate.

12. The apparatus of claim 9 including timer means for defining initializing interval of fixed duration; and wherein said means for varying said count number includes means responsive to said timer means defining said initializing interval for varying said count number at said fast rate.

13. Apparatus including oscillator circuitry adapted to be operatively connected to a remote inductive loop for monitoring the frequency of oscillation, said apparatus comprising;

timing means for measuring the time duration of a fixed number of cycles of said oscillator circuitry;

reference means defining a reference duration;

comparison means for determining the difference between said measured time duration and said reference duration;

feedback means responsive to said difference for varying said defined reference duration in a direction tending to reduce said difference toward zero; and call threshold means responsive to said difference exceeding a call threshold value for generating a call signal.

14. The apparatus of claim 13 wherein said call threshold means is responsive to said difference exceeding said threshold value only in one direction.

15. The apparatus of claim 13 including:

sequence control means defining successive detect cycles and wherein said timing means measures the duration of a fixed number of cycles during each detect cycle; and wherein said feedback means is capable of varying said reference duration during each detect cycle by a fraction of said said difference to incrementally reduce said difference toward zero.

16. The apparatus of claim 15 wherein said feedback means includes rate control means for selectively varying said reference duration at slow and fast rates, said rate control means being responsive to the direction and magnitude of said difference.

17. Apparatus including oscillator circuitry adapted to be operatively connected to a remote inductive loop for monitoring the frequency of oscillation, said apparatus comprising:

loop counter means for counting a fixed number of cycles of said oscillator circuitry;

reference means defining a reference duration;

a source of clock pulses;

error counter means for counting the number of clock pulses representing the difference between the duration of said fixed number of cycles and said reference duration;

means responsive to said error counter means for varying said reference duration in a direction to reduce said error counter means count toward zero; and call means responsive to said error counter means counting above a threshold value for generating a call signal.

18. The apparatus of claim 17 including means providing an indicating signal in the event said reference duration exceeds said duration of said fixed number of cycles; and wherein said call means includes means responsive to said indicating signal for generating said call signal.

19. The apparatus of claim 17 wherein said means for varying said reference duration includes control means for selectively varying said reference duration at either a slow or fast rate.

20. The apparatus of claim 17 further including means responsive to said call means generating a call signal for disabling said means for varying said reference duration for a predetermined interval.

* * * * *